United States Patent [19]
McGuffin

[11] Patent Number: 5,264,848
[45] Date of Patent: Nov. 23, 1993

[54] DATA COMPRESSION/DECOMPRESSION WITH ALIASING ERROR REDUCTION

[75] Inventor: John T. McGuffin, Albuquerque, N. Mex.

[73] Assignee: Honeywell Inc., Minneapolis, Minn.

[21] Appl. No.: 820,425

[22] Filed: Jan. 14, 1992

[51] Int. Cl.⁵ .............................................. H03M 7/30
[52] U.S. Cl. ......................................... 341/94; 341/51
[58] Field of Search .................... 341/94, 50, 51, 57, 341/56, 67

[56] References Cited

U.S. PATENT DOCUMENTS

| | | | |
|---|---|---|---|
| 4,862,167 | 8/1989 | Copeland, III | 341/107 |
| 5,049,881 | 9/1991 | Gibson et al. | 341/51 X |
| 5,151,697 | 9/1992 | Bunton | 341/51 |

Primary Examiner—Sharon D. Logan
Attorney, Agent, or Firm—Ronald E. Champion

[57] ABSTRACT

A data compression/decompression method incorporating aliasing error reduction. An array of terrain data is first scanned for a set of modes and indexes are assigned to those modes. These modes are used as precision points for compression and decompression. A compressed index database is created using the associated modes for the original terrain data. If the number of modes exceed a predetermined number the number of modes is collapsed using an aliasing technique. The alias error is tracked during the compression cycle. Total aliasing error is kept to a local minimum. The compressed data is decompressed by decoding and accessing the index database for the elevation alias. Further compression is accomplished using a lossless coding technique.

16 Claims, 7 Drawing Sheets

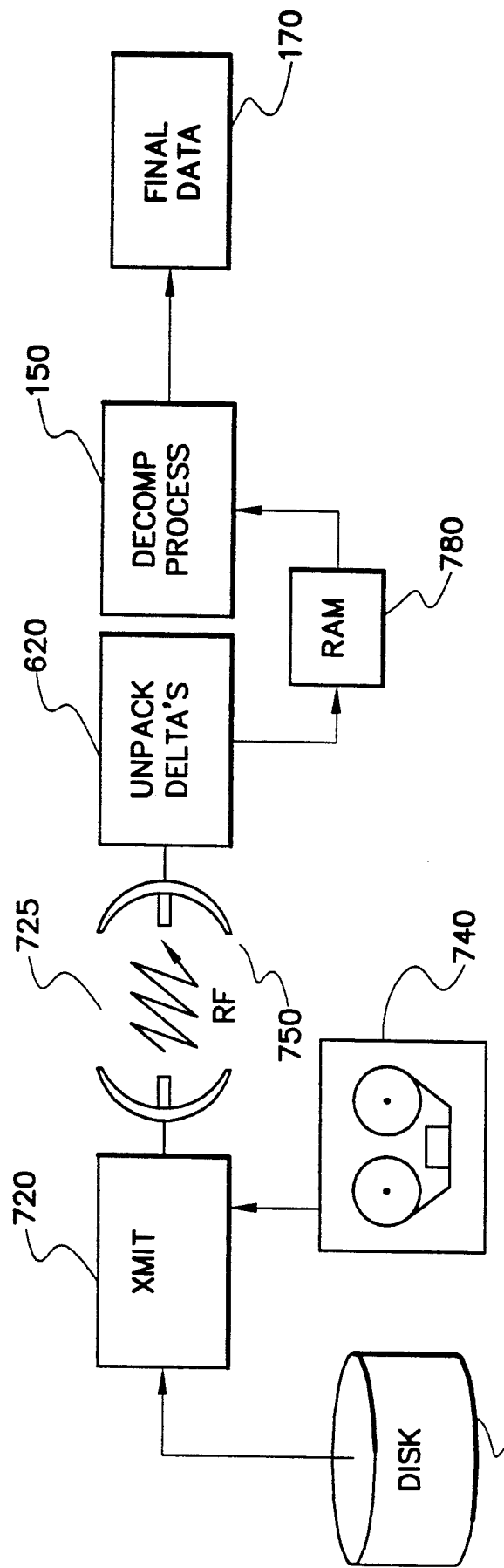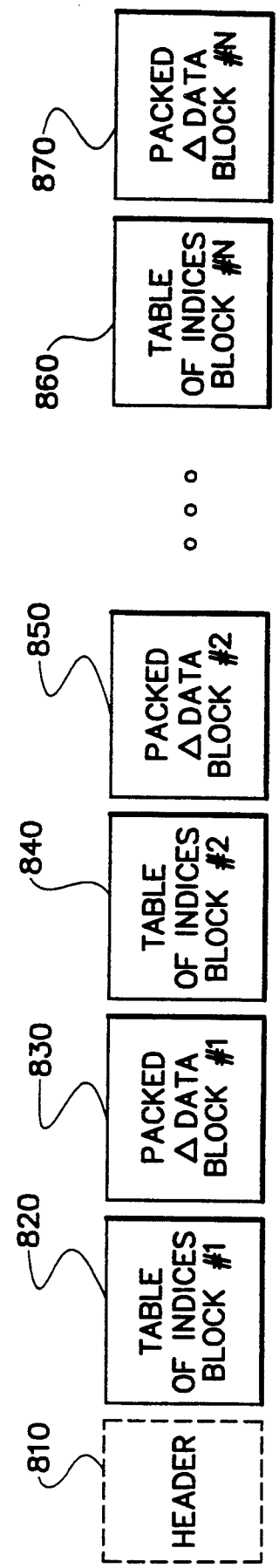
Fig. 8
Fig. 9

DATA COMPRESSION/DECOMPRESSION WITH ALIASING ERROR REDUCTION

BACKGROUND OF THE INVENTION

Field of the Invention

This invention relates to a method of reducing the amount of data storage required to store a set of multi-dimensional coordinates and a method to recover the coordinate positions from the reduced data and, more particularly, to a method of reducing the data storage requirements of a terrain referenced navigation system while also providing an aliasing error reduction method.

Background of Terrain Referenced Navigation

One prior art terrain aided navigation system is available from Sandia Labs. Sandia has created the Sandia Inertial Terrain-Aided Navigation (SITAN) flight-computer algorithm that produces a very accurate trajectory for low-flying, high-performance aircraft by combining outputs from a radar or laser altimeter, an inertial navigation system (INS), and a digital terrain elevation map. SITAN is a recursive, real time, terrain-aided navigation algorithm for use on fighter aircraft. The algorithm has been implemented in a popular microprocessor. The aircraft's position can be estimated within a 926 meter circle error of probability. A good description of the SITAN terrain aided navigation system can be found in the proceedings of the IEEE National Aerospace and Electronics Conference—NAECON, May 20-24, 1985 entitled *The AFTI/F16 Terrain-Aided Navigation System*, by D. D. Boozer, M. K. Lau, J.R. Fellerhoff, Sandia National Laboratories, Albuquerque, N.M. 87185.

SITAN utilizes Kalman filter algorithms to process geophysical measurements. The algorithm estimates errors in a flight path produced by an inertial navigation system following the equations given in the above-mentioned article.

The Kalman filter can be formed with the following state model:

$$\underline{\delta X_{k+1}} = \phi \underline{\delta X_k} + \underline{W_k}$$

and the measurement $$C_k = C(X_k) + V_k$$
$$= Z_k - h(.,.) + V_k$$

where
$\underline{\delta X_k}$ = INS error states to be estimated
$\Phi$ = state-transition matrix for INS errors
$\underline{X_k}$ = states of INS and aircraft
$C_k$ = ground clearance measurement
$Z_k$ = altitude of aircraft
h = height of terrain at position (.,.)
$\underline{W_k}$ = driving noise with $E(\underline{W_k}) = \underline{O}$ for all k and $E(\underline{W_k}\underline{W_j}^T) = Q_k \delta_{kj}$
$V_k$ = measurement error with $E(V_k) = O$ for all k and $E(\underline{V_k}\underline{V_j}) = R_k \delta_{kj}$
k = Subscript denoting time k.

Since the measurement function $c(\underline{x})$ is a nonlinear function of the states, the standard extended Kalman filter approach is used to obtain the measurement matrix, $$H_k = \frac{\partial c(X)}{\partial X} \bigg| X = X_k(-) = [-h_x, -h_y, 1, 0, 0 \ldots]$$

where $h_x$ and $h_y$ are the terrain slopes in the x and y directions of the map evaluated at $\underline{X}_k(-)$, the predicted aircraft position just before a measurement is processed at time k. The first three states are taken to be the x position, y position, and altitude, respectively. At any time k, $$\underline{X} = \underline{X}_{INS} + \underline{\delta X}$$

The state vector often used in a single filter implementation is $$\underline{\delta X} = [\delta X \delta Y \delta Z \delta V_X \delta V_Y]^T$$

where $\delta X$ $\delta Y$ $\delta Z$ $\delta V_X$, and $\delta V_Y$ are errors in the X position, Y position, altitude, X velocity, and Y velocity, respectively. Other INS errors and states can also be included in $\underline{\delta X}$ by using the proper $\Phi$.

Parallel SITAN was developed because the distance needed by SITAN to reach steady state becomes excessive as initial position errors (IPEs) approach several hundred meters. Parallel SITAN is a bank of extended Kalman filters that process identical altimeter measurements. After some updates, the filter with the minimum average weighted residual squared (AWRS) value is identified as having the correct position estimate. The AWRS value is defined by $$AWRS_{jth\,filter} = \frac{1}{n} \left[ \sum_{i=1}^{n} \frac{\Delta_i^2}{H_i P_i H_i^T + R_i} \right]_{jth\,filter}$$

where $\Delta_i$ is the residual at the ith update, n is the number of updates, and $HPH^T + R$ is the residual variance. Once the IPEs are reduced by the parallel filters, a single filter performs well, starting off essentially in steady state.

To implement parallel SITAN, the number and geometrical layout of the parallel filters needed to cover an IPE must be specified. A square, constant-spaced grid can be used to center the filters about the horizontal position indicated by the INS. Filters at and near the corners are then eliminated to reduce the number of filters. To further lighten the computational burden, three-state, instead of five-state, filters are often used in parallel SITAN with $$\underline{\delta X} = [\delta X \delta Y \delta X]^T$$

For both the single and parallel filter implementation, a least-squares plane fit to the map, known as stochastic linearization, is used to compute the slopes, $h_X$ and $H_Y$. Horizontal uncertainties $\sigma_x$ and $\sigma_Y$ from the error-covariance matrix, defined by $$P = E\left[\left(\underline{\delta X} - \underline{\hat{\delta X}}\right)\left(\underline{\delta X} - \underline{\hat{\delta X}}\right)^T\right]$$

and $$Diag\, P = [\sigma_X^2 \sigma_Y^2 \sigma_Z^2 \sigma_{V_X}^2 \sigma_{V_Y}^2]$$

and are used to determine the size of the plane. Residuals from the plane fit, $RFIT_k$, are added to the measurement error variance, $R_k$, to ensure that the SITAN filter assigns less weight to the measurement when the plane fit is either very large or is over a rough area, thus adapting to local terrain.

SITAN has three basic modes: acquisition mode, lost mode and track mode.

Acquisition Mode

When one of the filters identifies a reliable estimate of true aircraft position, the track mode is entered. A single five state Kalman filter is initialized at the estimated acquired position. During track mode, the aircraft's position is estimated every 100 meters. SITAN employs a mode control logic concept to handle the transition from track to lost and from acquisition to track.

Acquisition mode is used to locate the aircraft's position within a circular region of uncertainty. The region of uncertainty is called the circular error of probability or CEP. In SITAN a 2100 meter initial position CEP is covered with 57 3-state Kalman filters centered on a grid whose initial positions are 525 meters apart.

The state acquisition filters include error states. They can estimate an aircraft's position under significant INS velocity errors. Each filter is initialized with position error estimates. To ensure that erroneous information is not employed to update the filters, none of the filters are updated if the pitch altitude is greater than 30 degrees or if the altimeter loses lock or the INS fails.

If the mode control logic of SITAN indicates that the aircraft has deviated from the 2363 meter search area, the lost mode is initiated. The lost mode ceases to provide position estimates for the aircraft, and the pilot has to update the inertial navigation before restarting SITAN.

Track Mode

Track mode estimates the position of the aircraft during flight. The five state tracking filter is used. The acquisition mode initializes the track filters. The track mode makes estimates of terrain slopes in rectangles surrounding the center of the aircraft position. The track filters are not updated during track mode unless the inertial navigation system, altimeter, and other flight data are valid.

Track mode is entered when the aircraft's actual position is close to the estimated one. In the event of a false fix, the track filter is set at the wrong position and the SITAN algorithm will proceed as if it was correct. This produces large errors in estimated positions. It is imperative that the probability of a false fix be kept low. The following is taken from the above-mentioned article in regard to the mode control logic of SITAN.

With the design for the acquisition, lost, and track modes as described above, the mode-control logic is needed to determine in which mode the algorithm should operate. When large aircraft position errors exist, it should choose the acquisition mode; with small errors, the track. The main parameter used in the mode-control logic for transition from acquisition to track is the AWRS. FIG. 7 shows a cross-section of a three-dimensional AWRS surface where AWRS is a function of the parallel filter positions $(X_j, Y_j)$. In the acquisition mode the parallel filters will tend to migrate to the relative minima of this surface.

To keep the parallel filters from migrating too far from their initial positions, a maximum of 128 updates is allowed. Four tests are performed after every 32 updates to determine if transition to the track mode is possible by selecting the acquisition filter with the minimum AWRS. Test 1 requires the selected filter to have an AWRS lower than a threshold value to ensure that the parallel filters are indeed over the correct aircraft position. If the parallel filters are configured over an area which does not include the true aircraft position, the global minimum of the AWRS curve is expected to shift upward. Test 2 requires contrast in the terrain, a sufficient difference between $AWRS_{min}$ and $AWRS_{max}$ to prevent transition to the track mode over very smooth areas such as water. Test 3, the false-fix test, requires that the minimum AWRS outside of an exclusion region, $AWRS^*_{min}$ does not compete with $AWRS_{min}$, where the size of the exclusive region is computed using $\sigma_x$ and $\sigma_Y$ of the selected filter. Statistically, as more updates are made, the separation between the global minimum and relative minima can be realized and still retain the same confidence level. Therefore, the required separation between $AWRS^*_{min}$ and $AWRS_{min}$ should be a function of $1/n$, where n is the number of updates. Test 4 requires the $\sigma_X$ and $\sigma_Y$ of the selected filter to be smaller than its initial value, 200 m, indicating that improvements have been made in estimating the aircraft's position during acquisition.

If track is not entered after 128 updates, a test for the lost mode is made. If $AWRS_{min}$ is greater than a threshold, the lost mode is entered and AFTI/SITAN will not produce any more estimates until the pilot updates the INS, which will automatically restart AFTI/SITAN in the track mode. If the lost condition is not met, the parallel filters are reset and acquisition starts over. This process continues until track or lost mode is entered.

Once in track, the track filter's $\sigma_x$ and $\sigma_Y$ are checked continuously while its AWRS is checked every 64 updates. If either the $\sigma$'s or the AWRS is too high, AFTI/SITAN switches back to the acquisition mode. The test on $\sigma$ prevents the track filter from using excessively large plane fits to maintain track after flying over smooth terrain for a long time. The AWRS test checks for unbelievable filter residuals.

Discussion of the Prior Art

Data storage requirements in real time computer applications require voluminous amounts of information to be stored both in RAM and on permanent storage devices such as a disk or tape. Most real time applications of data storage require some sort of a mapping of a real environment or a set of parameters. In the area of mapping and navigation, the problem of characterizing the environment in a multi-dimensional database is even more complicated and more complex. The types of information stored in such real time, real world applications range from the physical to the topological characteristics of the location.

A good example of a real time application that is characterized by large data storage requirements is a terrain referenced navigation system in which each physical feature of a terrain area is mapped into memory. This representation of the terrain resides on a permanent storage medium such as a magnetic disk, tape, or optical disk and is referenced in the usual fashion of latitude and longitude. In the case of a terrain referenced navigation system, the elevation of each latitude and longitude sampled point is stored. For instance, if an area is to be represented in a latitude/longitude elevation survey, it would require, for each latitude/longitude point, a certain number of bits equal to the resolution of the height being resolved. For example, if 256 discrete elevations are to be resolved, then 8 bits of data need to be dedicated to each latitude/longitude point. In another example, if 65,000 elevations are to be resolved then 16 bits of data need to be assigned to every latitude/longitude point. In yet another example, a 1,000×1,000 latitude/longitude grid storing 16 points of data for each elevation would require 16 million bits of data storage.

The prior art method of reducing data storage requirements for terrain referenced navigation real time applications utilized the discrete cosine transform/differential pulse code modulation method. While this method achieves very high compression ratios, it also introduces relatively large data errors when compared to the method described herein. Traditional methods of data compression and decompression require that the information no longer be viewed as a latitude/longitude elevation study, but in fact be viewed as a set of sequential serial bit streams which are compressed using various schemes well known in the prior art. Sequential bit stream compression algorithms cannot be used in flight trajectory algorithms. Since elevation data must be available for any given flight path, the elevation data must be directly accessible for any randomly chosen latitude/longitude the aircraft happens to overfly. This drawback of the prior art, along with the advantages of using data compression and decompression are important motivations for the invention.

Prior art data compression and decompression algorithms have also suffered from aliasing error. Aliasing error is the error induced when real world analog information is quantized in a digital fashion. A good example of this is the quantization of altitude data wherein the altitude ranges from 0 feet above sea level to 1,000 feet above sea level where 100 samples will be taken. The accuracy of any sample relative to other samples will be 10 feet. There are 100×10 samples being taken. In this example, the aliasing error would be five feet because such sampling provides an accurate representation of the altitude within five feet. As a more specific example, if a sample point is taken at 910 feet, this technique assures that the data point value ranges between 910−5 and 910+5 feet. Thus, the aliasing error of the sampling technique, or the storage technique that is required when any analog real time system is being converted to a digital processing system, is the fundamental limitation on accuracy inherent in any scheme whether it is data compression or just data storage.

SUMMARY OF THE INVENTION

This invention uses a method of data compression and decompression including aliasing error reduction utilizing a statistical approach. An array of real world data is scanned for a set of modes. Each mode represents a database population density that is most popular. These most popular modes are used as precision points in a data compression and decompression scheme such that all nonmodal points are referenced to a mode point. During mode analysis, the alias of the decompression is tracked and kept such that the total aliasing error is reduced to a minimum or eliminated.

It is an object of this invention to provide an improved data compression/decompression method and apparatus that reduces the amount of data storage required to store real time data in a mode such that it is still randomly addressable by its principle addressing characteristics.

It is another object of this invention to provide an improved data compression/decompression method and apparatus that is able to decompress the information stored using the compression algorithm described above.

It is yet another object of this invention to provide an improved data compression/decompression method and apparatus that is able to reduce the aliasing error involved in digitizing, compressing and decompressing data.

It is still another object of this invention to provide an improved data compression/decompression method and apparatus that is able to have the decompression phase of the process performed in real time.

It is another object of this invention to provide an improved data compression/decompression method and apparatus that stores latitude and longitude elevation data in a compressed form representing a terrain referenced navigation database.

It is another object of this invention to provide an improved data compression/decompression method and apparatus that decompresses information stored in a terrain referenced navigation system.

Other objects, features and advantages of the present invention will become apparent to those skilled in the art through the Description of the Preferred Embodiment, Claims, and Drawings herein wherein like numerals refer to like elements.

BRIEF DESCRIPTION OF THE DRAWINGS

To illustrate this invention, a preferred embodiment will be described herein with reference to the accompanying drawings. The preferred embodiment concerns the compression and decompression of a source database, such as a terrain referenced database or a video image database.

FIG. 8 shows a data flow diagram of one embodiment of the method of the invention useful for broadcast.

FIG. 9 shows a data flow diagram of the structure of compressed data employed in one embodiment of the invention.

DESCRIPTION OF THE PREFERRED EMBODIMENT

Figure 1:
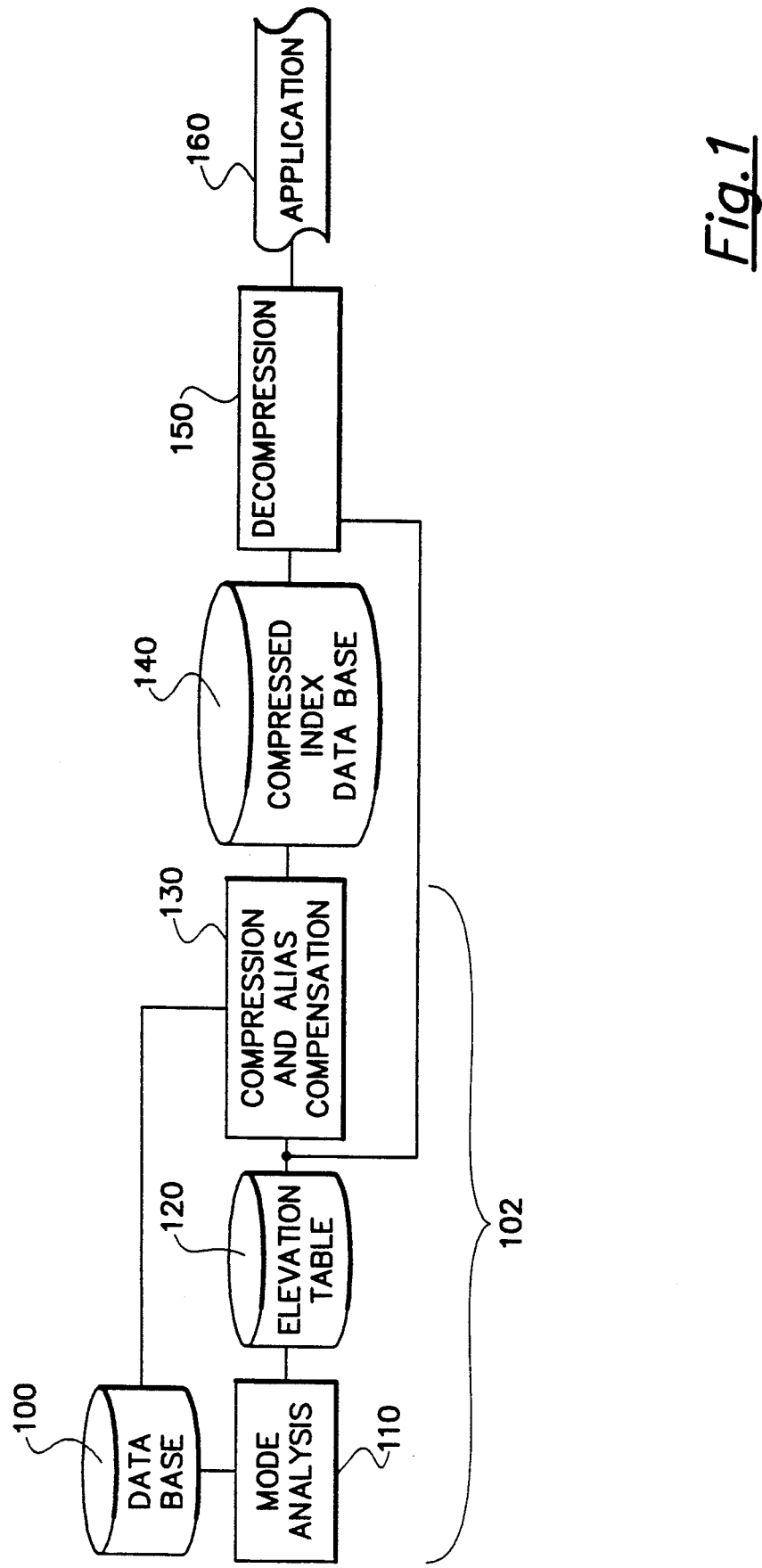
FIG. 1 shows a data flow block diagram of one embodiment of the method of the invention including the mode analysis process, data compression process and data decompression process.

FIG. 1 shows a data flow block diagram of the method of the invention. The data flows from a database 100 through a mode analysis process 110, to an elevation table database 120. Compression and alias compensation 130 are performed to create a compressed index database 140, the data is then decompressed 150, and may be used by an application 160 such as a TRN application. The method of the invention may advantageously be implemented as a software process on a standard microprocessor or implemented in hardware using specialized components for system functions. The database that is to be compressed could be a data representation of a visual scene or topology.

The database 100 can be arranged in any fashion, typically through an addressing scheme familiar to those in the art. The database 100 is read by the mode analysis function 110 which calculates the most popular modes of the database. A mode is a statistical concept that defines the database 100 as having a population whose elements are most popularly around the mode. The mode constitutes more of these values in the database 100 than any others. The invention calculates the primary mode and then a plurality of secondary modes until enough modes are found to constitute the elevation table database 120. In an embodiment of the invention used for terrain referenced navigation, 256 modes are checked which represent 8 bits of data storage in the compressed index database 140. The mode analysis process 110 determines the most popular set of modes and stores this information in the elevation table database 120. The elevation table 120 is then used by the compression and alias compensation step 130 to determine the compensation and compression of the database 100. The compensation and alias compression step 130 uses the elevation table database 120 and the original database 100 to compress the data and store it in the compressed index database 140. The decompression and alias compensation step 150 utilizes the compressed index database 140 as well as the elevation table database 120. The application program 160 receives decompressed data from the decompression step 150.

Figure 2:
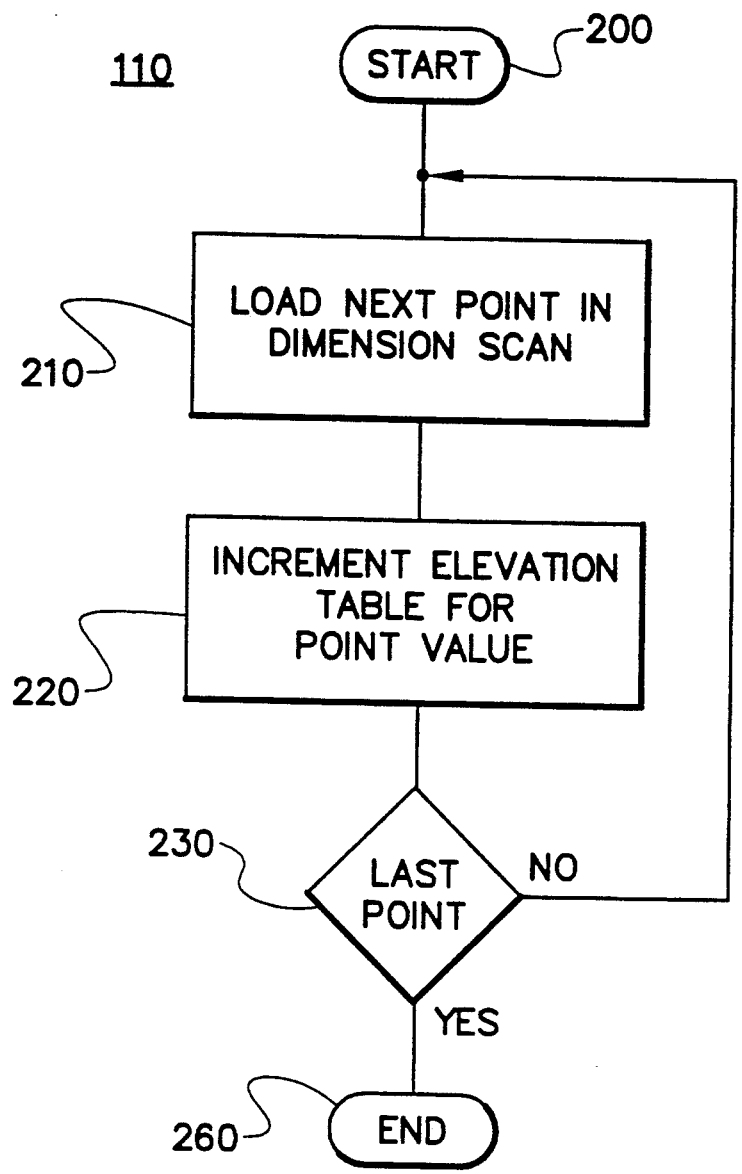
FIG. 2 shows a flow diagram of one embodiment of the mode analysis method of the invention including the method for frequency counting.

FIG. 2 shows a flow diagram of one example embodiment of the mode analysis process 110. The mode analysis starts at process block 200. The next point in the database 100 is loaded at step 210 which initially is the first point. The frequency array update step 220 counts the frequency of each value in the database 100. For instance, if the point in the database 100 has a value of 1000 then the frequency array for 1000 is incremented by 1 by process step 220. At step 230, a check is made to determine whether all points have been analyzed in the database 100. If the point checked is not the last point in the database, then the process flow returns to step 210 to load the next point from the database 100. If the next point is the last point, then the process flows to step 260 and ends.

Figure 3:
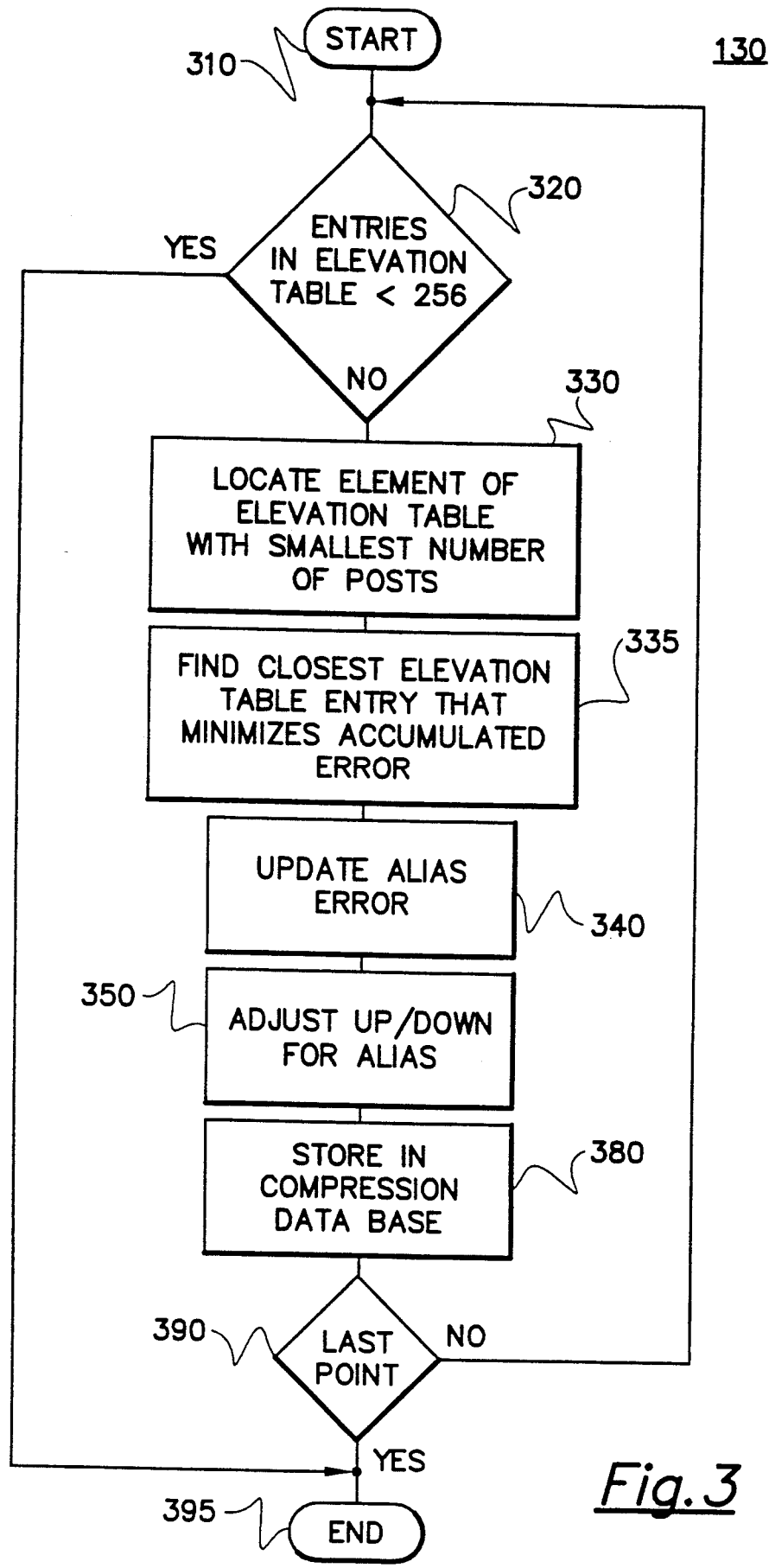
FIG. 3 shows a flow diagram of one embodiment of the compression method of the invention, including the alias adjustment process.

FIG. 3 shows a flow diagram of one example embodiment of the compression and aliasing compensation method 130. The compression and aliasing compensation method starts at block 310. At step 320 a check is made to determine whether the number of entries in the elevation table 120 is less than 256. If there are less than 256 entries in the elevation table 120 then the process ends at step 395. If there are more than 256 entries in the elevation table 120 then the process flows to step 330 to locate the element of the elevation table 120 with the smallest number of posts. Once the element of the elevation table 120 is found that has the smallest number of posts the process flows to step 335 to find the closest elevation table entry that minimizes the accumulated error from the aliasing procedure. This process is further described below with reference to FIG. 5 and an example. The process then flows to step 340 to update the accumulated alias error. The alias error is the accumulation of all alias errors over all point values. The process flows to step 350 where the aliased values are adjusted up or down to minimize the accumulated error. The process then flows to step 380 where the aliased compressed data index is stored. Those skilled in the art will appreciate that the compressed index data may be stored in an independent database of compressed indexes or in RAM. The process flows to 390 where a check is made to determine whether or not this is the last point. If it is, then the process ends at step 395, if it isn't the process returns to step 320 to check the next point in the dimension scan.

Figure 4:
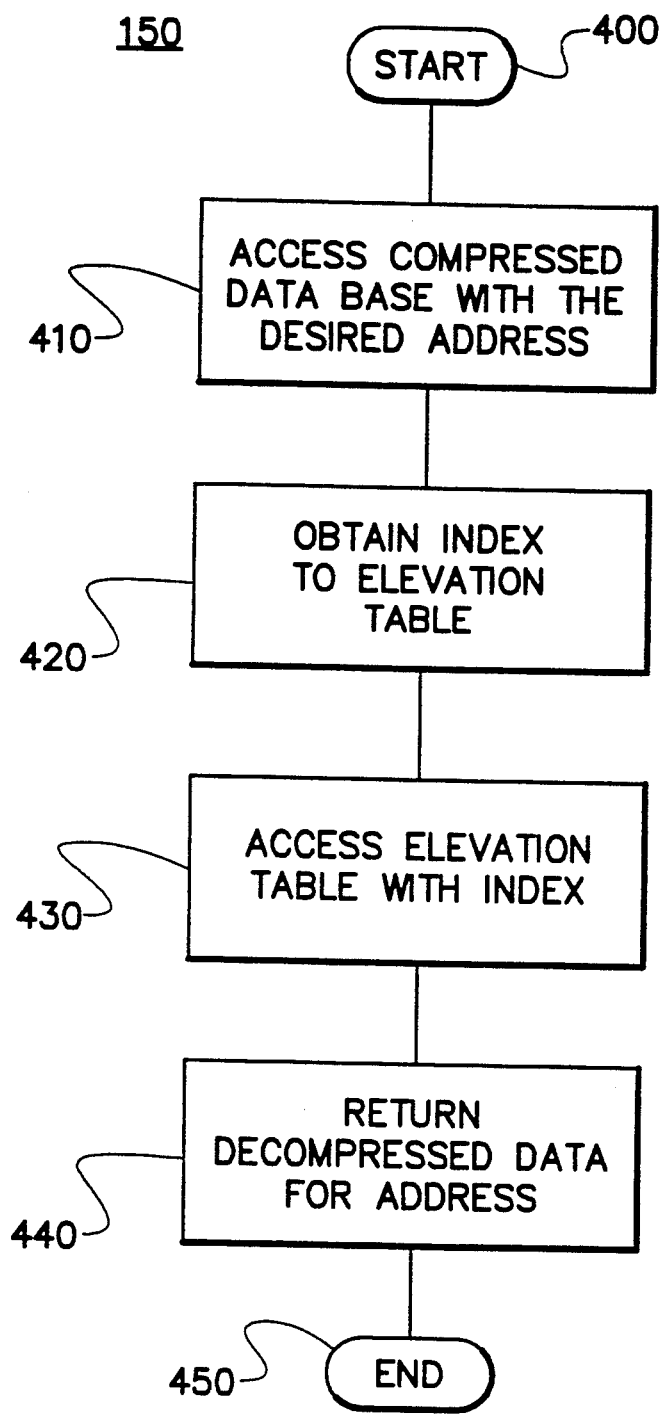
FIG. 4 shows a flow diagram of one embodiment of the decompression method of the invention including decompression of the compressed index database.

FIG. 4 shows a block diagram of one example of the method of decompression and alias compensation 150. The process starts at step 400. The address of the point to be decompressed is used to access the compressed index database at step 410. The desired point index value is obtained in step 420 from the compressed index database 140. The process next flows to step 430 where the point value is returned to its full resolution by accessing the elevation table 120 with the index. The original point may have had a resolution of 16 bits where the compression process compressed it to an 8 bit index, the original 16 bits are restored from the elevation table 120. The process then flows to step 440 where the decompressed data is returned with the full resolution. The process ends at step 450.

Now that the structure of the data compression and decompression method of the invention has been described an example will be given to better illustrate the principals and theory of operation of the invention.

All compression/decompression processes fall into one of two classes: (1) lossless; and (2) not lossless. The method of the invention may allow both if there is a large enough modulus of index for a given set of data, it may always be possible to make it lossless, and still obtain some compression. However, in practice, the modulus of index is a hardware constraint which a given dataset must be constrained to live with. Therefore, in general, the process of the present invention will produce data that in some cases is not lossless. However, the losses are a function of the modulus of index and are minimal for a certain modulus index in a given data set. In addition, the decompression step 150 of the invention can be accomplished in a relatively very short time. This rapid processing characteristic lends itself well to applications where preprocessing has no realtime constraints, such as taping a television show or movie and editing it, etc.

Figure 5:
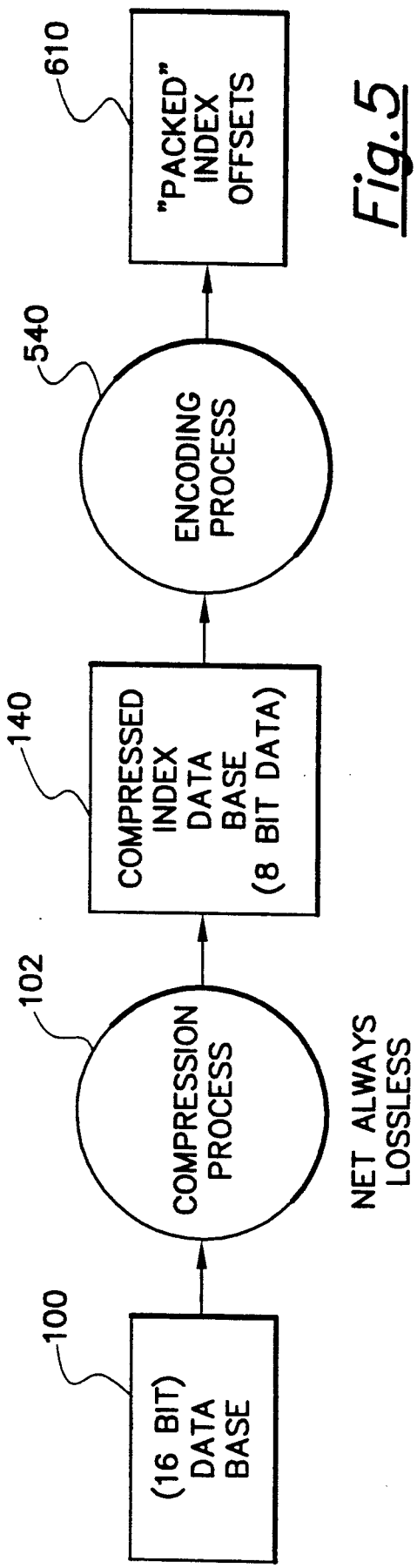
FIG. 5 shows a data flow diagram of one embodiment of the compression and coding process of the invention.

Now referring to FIG. 5, a dataflow diagram of the method of the invention is shown as applied to a TRN example. In the TRN example, the size of the data for one embodiment of the invention is an array of 200×200 points, known as posts, each with 16 bits of elevation information or 40,000×2 bytes/post for a total storage requirement of 80K bytes. The compression process 102 is an algorithm where 16 bits of elevation data are represented by an 8 bit index in a table of elevation values. Those skilled in the art will appreciate that it could be a 10 bit index or a 4 bit index or any other desired modulus of index. In one embodiment, the modulus was chosen to be 8 to yield approximately a 2:1 compression that did not induce excessive error.

As described with reference to FIG. 2 the process builds an elevation table of all the unique elevations in the 200×200 array of data. For example, to represent terrain in the state of Kansas might require two hundred and twenty unique elevations. The data for this example is listed in Table 1.

TABLE 1

| Index | Elevation | Number of Posts With This Elevation |
|---|---|---|
| 1 | 346 | 36 |
| 2 | 347 | 20 |
| 3 | 348 | 27 |
| 4 | 349 | 31 |
| 5 | 350 | 18 |
| 6 | 351 | 12 |
| 7 | 353 | 65 |
| 8 | 356 | 90 |
| . | . | . |
| . | . | . |
| 220 | 591 | 30 |

The compression process 102 proceeds by reading the 40,000 data post elevations, looking each one up in the elevation table 120 and noting its index. Since there are fewer than 256 entries in the elevation table 120, the index is expressible in 8 binary digits. However, if there are more than 256 unique elevations in the initial elevation table, the process proceeds to change the data such that there are only 256 different, unique elevations.

The process modifies the data to accomplish two goals:

1. Change the least amount of data necessary to fit the given modulus.
2. Change the data in such a way as to make the mean error approach zero.

The compression method of the invention proceeds by selecting the elevation table 120 entry with the smallest number of posts associated with a particular elevation (column 3 in Table 1) and changes all the elements of the elevation table 120 and the compressed index database 140, with that elevation to some other elevation which is closest to the original elevation in either a plus or minus direction following the method of the invention described below.

For example, elevation 351 at index 6 is selected since it has only twelve members. Those twelve members are changed from 351 to 350 in the block of data and entry 6 is eliminated from Table 1. The process of the invention may optionally choose to select the entry with the minimal entry in column 3 of the table and alias it to its neighbor and eliminate it until the table has only 256 entries. This approach satisfies the minimal error objective in that it modifies the minimum amount of data necessary to fit the given modulus; here assumed to be 8 binary digits.

The compression process 102 further proceeds by accumulating the total induced error $ERROR_{CUM}$ for the block of data as a whole. In our example, we changed 12 posts from an elevation of 351 feet to an elevation of 350 feet so that the $ERROR_{CUM} = -12$ feet. Since the accumulated error is negative, the next entry will process UP rather than DOWN.

For example, the next lowest entry in Table 1 is index 2 at elevation 347 with 20 members represented. Since the $ERROR_{CUM}$ is negative it is aliased to index 3 (or UP the index count) and all 20 data block entries of 347 are replaced with a new value, 348, and 347 is eliminated from the table. Then, the accumulated error becomes $$ERROR_{CUM} = -12 + 20 = +8$$

The process will then alias down in the next compensation cycle. In so doing, the accumulated absolute error will stay near zero rather than becoming large in a positive or negative sense.

Table 2 represents the results of compression process 102 on the elevation table 120.

TABLE 2

| Index | Elevation | No. Posts |
|---|---|---|
| 1 | 346 | 36 |
| 2 | 348 | 42 |
| 3 | 349 | 31 |
| 4 | 350 | 30 |
| 5 | 353 | 65 |
| 6 | 356 | 90 |
| . | . | . |
| . | . | . |

The next candidate to alias from Table 1 is index 4 at 350 with 30 members. Index 4 has been moved once, so a new column is added to the table where the maximum induced error for that entry is noted.

An example illustrating the alias technique is shown in Table 3.

TABLE 3

| Index | Elevation | # Posts | | Max Error |
|---|---|---|---|---|
| H | 1 | 5 | | 0 |
| I | 2 | 3 | | 0 |
| J | 3 | 1 | | 0 |
| K | 4 | 99 | | 0 |
| L | 5 | 2 | | 0 |
| M | 6 | 4 | | 0 |
| N | 7 | 6 | | 0 |
| | | | $ERROR_{CUM}$ | 0 |
| 1st Pass: Index J goes into K | | | | |
| H | 1 | 5 | | 0 |
| I | 2 | 3 | | 0 |
| J | ( ) | ( ) | | ( ) |
| K | 4 | 100 | $\lvert +1 \rvert =$ | 1 |
| L | 5 | 2 | | 0 |
| M | 6 | 4 | | 0 |
| N | 7 | 6 | | 0 |
| | | | $ERROR_{CUM} =$ | +1 |
| 2nd Pass: Index L goes into K | | | | |
| H | 1 | 5 | | 0 |
| I | 2 | 3 | | 0 |
| J | ( ) | ( ) | | ( ) |
| K | 4 | 102 | $\lvert +1, -1 \rvert =$ | 2 |
| L | ( ) | ( ) | | ( ) |
| M | 6 | 4 | | 0 |
| N | 7 | 6 | | 0 |
| | | | $ERROR_{CUM} =$ | −1 |
| 3rd Pass: index I goes into K | | | | |
| H | 1 | 5 | | 0 |
| J | ( ) | ( ) | | ( ) |
| K | 4 | 105 | $\lvert 1+2, -1 \rvert =$ | 3 |
| L | ( ) | ( ) | | ( ) |
| M | 6 | 4 | | 0 |
| N | 7 | 6 | | 0 |
| | | | $ERROR_{CUM} =$ | 5 |
| Next pass pub M into K | | | | |
| H | 1 | 5 | | 0 |
| I | ( ) | ( ) | | ( ) |
| J | ( ) | ( ) | | ( ) |
| K | 4 | 109 | $\lvert 1+2, -2 \rvert =$ | 4 |
| L | ( ) | ( ) | | ( ) |
| M | ( ) | ( ) | | ( ) |
| N | 7 | 6 | | 0 |
| | | | $ERROR_{CUM} =$ | −3 |
| Next pass put H into K | | | | |
| H | ( ) | ( ) | | ( ) |
| I | ( ) | ( ) | | ( ) |
| J | ( ) | ( ) | | ( ) |
| K | 4 | 114 | $\lvert +3, -2 \rvert =$ | 5 |
| L | ( ) | ( ) | | ( ) |
| M | ( ) | ( ) | | ( ) |

TABLE 3-continued

| Index | Elevation | # Posts | | Max Error |
|---|---|---|---|---|
| N | 7 | 6 | | 0 |
| | | | ERROR$_{CUM}$ = | +12 |
| Last Pass put N into K | | | | |
| H | ( ) | ( ) | | ( ) |
| I | ( ) | ( ) | | ( ) |
| J | ( ) | ( ) | | ( ) |
| K | 4 | 120 | \|+3, −3\| = | 6 |
| L | ( ) | ( ) | | ( ) |
| M | ( ) | ( ) | | ( ) |
| N | ( ) | ( ) | | ( ) |
| | | | ERROR$_{CUM}$ = | −6 |

Table 3 has been reduced by six entries and has a cumulative error of −6. In addition, the worst case error for any post is |3| feet. Therefore, the compression process 102 searches column 4 first, looking for the minimum error entries. Of all data points with the same absolute value, it selects the one with the fewest number of posts and aliases UP or DOWN to minimize the total cumulative error. The aliased value is removed from the table and the process loops until the desired number of entries remain. Therefore, this results in an "aliased" surface which is a minimum representation of the original surface for a given modulus.

The compression process 102 has produced a set of 200×200×8 bit indexes which is stored in the compressed index database 140 or in a RAM array, and a table of 256 elevation values in the elevation table 120 which could also be in RAM.

The decompression process 150 proceeds as follows: retrieve the elevation at point (i,j), look up the index stored in the compressed database 145 or RAM (i,j) to obtain the 8 bit index K. This takes one memory fetch. Then look up K in the elevation table 120, which takes one memory fetch, and the associated 16 bit elevation is obtained. Thus, to get a 2:1 data compression costs only one extra memory reference at utilization time (25 nsec).

Referring again to FIG. 5 which shows an encoding process 540 which further compresses the indexes in the compressed index database 140 for more efficient storage on disk or tape. Terrain data like most visual data is fairly well-behaved, in the sense that adjacent data generally is 2nd derivative continuous, or close together in elevation in the terrain example (or color/contrast in the TV example). A line of elevation posts (row or column) in a block of data have elevations which are close together, and so, when quantized and expressed as a series of indices in a table, the absolute value of consecutive posts have indices which are close together.

Experimental data shows that in a block of data which was 256 ×256, that more than 92% of the elevation posts when expressed as modules 256 indices were within ±7 of the index of the post next to them. If the difference in the indices of all the elevations in a given block of data were ±7, another 2:1 compression could have been accomplished, with no additional error.

For example, consider a row of index data:

| | 1 | 2 | 3 | 4 | 5 | 6 | 7 | 8 | 9 |
|---|---|---|---|---|---|---|---|---|---|
| indices | 3 | 7 | 9 | 11 | 14 | 15 | 16 | 16 | 15 |
| | | V | V | V | V | V | V | V | V |
| differences | | +4 | +2 | +2 | +3 | +1 | +1 | 0 | −1 |
| 8 bit | | 0100 | 0010 | 0010 | 0011 | 0001 | 0001 | 0000 | 1001 |

-continued

| | 1 | 2 | 3 | 4 | 5 | 6 | 7 | 8 | 9 |
|---|---|---|---|---|---|---|---|---|---|
| bytes | | | | | | | | | |

Two differences can be expressed in one 8 bit byte. Similarly, when the terrain is flatter, many of the consecutive data in a row fall within ±1 of the previous index data. This would only require 1 bit and a second bit to show differences of +1, 0, −1 in the indexes of adjacent posts, allowing the packing of four data points in an 8 bit word.

The following cases must be distinguished:
1. one eight bit index per byte.
2. two four bit "nibbles" per byte (difference)
3. three two bit "quarters" per byte (difference)
4. Four two bit "quarters" per byte (difference).

To accomplish these distinctions, the table of indexes must be reduced to 254 and two unique 8 bit values must be created as flags to denote the system state.

Since case 3 above is a subset of case 4 with a "null" in lower two bits there are only three cases. Since from any given case there are only two other cases to transition to, only 2 flags are required.

The method of the invention proceeds as follows. Put out the first index as an 8 bit byte (1:1). Then if at least four following indices are within ±7 but not ±1, write out the flag 1 byte (0000 0000) and begin packing indices two to a byte. When transitioning back to 1:1 write out a 1000 0000 or when transitioning to 4:1 write out another 0000 0000, as shown on the diagram above. Continue this process until out of data for the block.

Data which is packed into 4 bit nibbles to a byte has the following translation table:

| | | | |
|---|---|---|---|
| FF = −7−7 | DF = −5−7 | BF = −3−7 | 9F = −1−7 |
| FE = −7−6 | DE = −5−6 | BE = −3−6 | 9E = −1−6 |
| FD = −7−5 | DD = −5−5 | BD = −3−5 | 9D = −1−5 |
| FC = −7−4 | DC = −5−4 | BC = −3−4 | 9C = −1−4 |
| FB = −7−3 | DB = −5−3 | BB = −3−3 | 9B = −1−3 |
| FA = −7−2 | DA = −5−2 | BA = −3−2 | 9A = −1−2 |
| F9 = −7−1 | D9 = −5−1 | B9 = −3−1 | 99 = −1−1 |
| F8 = −7−0 | D8 = −5−0 | B8 = −3−0 | 98 = −1−0 |
| F1 = −7+1 | D1 = −5+1 | B1 = −3+1 | 91 = −1+1 |
| F2 = −7+2 | D2 = −5+2 | B2 = −3+2 | 92 = −1+2 |
| F3 = −7+3 | D3 = −5+3 | B3 = −3+3 | 93 = −1+3 |
| F4 = −7+4 | D4 = −5+4 | B4 = −3+4 | 94 = −1+4 |
| F5 = −7+5 | D5 = −5+5 | B5 = −3+5 | 95 = −1+5 |
| F6 = −7+6 | D6 = −5+6 | B6 = −3+6 | 96 = −1+6 |
| F7 = −7+7 | D7 = −5+7 | B7 = −3+7 | 97 = −1+7 |
| EF = −6−7 | CF = −4−7 | AF = −2−7 | 8F = −0−7 |
| EE = −6−6 | CE = −4−6 | AE = −2−6 | 8E = −0−6 |
| ED = −6−5 | CD = −4−5 | AD = −2−5 | 8D = −0−5 |
| EC = −6−4 | CC = −4−4 | AC = −2−4 | 8C = −0−4 |
| EB = −6−3 | CB = −4−3 | AB = −2−3 | 8B = −0−3 |
| EA = −6−2 | CA = −4−2 | AA = −2−2 | 8A = −0−2 |
| E9 = −6−1 | C9 = −4−1 | A9 = −2−1 | 89 = −0−1 |
| E8 = −6−0 | C8 = −4−0 | A8 = −2−0 | 88 = −0−0 |
| E1 = −6+1 | C1 = −4+1 | A1 = −2+1 | 81 = −0+1 |
| E2 = −6+2 | C2 = −4+2 | A2 = −2+2 | 82 = −0+2 |
| E3 = −6+3 | C3 = −4+3 | A3 = −2+3 | 83 = −0+3 |
| E4 = −6+4 | C4 = −4+4 | A4 = −2+4 | 84 = −0+4 |
| E5 = −6+5 | C5 = −4+5 | A5 = −2+5 | 85 = −0+5 |
| E6 = −6+6 | C6 = −4+6 | A6 = −2+6 | 86 = −0+6 |
| E7 = −6+7 | C7 = −4+7 | A7 = −2+7 | 87 = −0+7 |

Notice that the two zero byte terminators which are used to toggle between states are:

1.   0000 0000 = 00 Hex

-continued

| | |
|---|---|
| 2. | 1000 0000 = 80 Hex |

Neither of these unique codes are represented below so that they will not be confused with a packed index.

2:1 Codes

| | | | |
|---|---|---|---|
| 1F = 1−7 | 3F = 3−7 | 5F = 5−7 | 7F = 7−7 |
| 1E = 1−6 | 3E = 3−6 | 5E = 5−6 | 7E = 7−6 |
| 1D = 1−5 | 3D = 3−5 | 5D = 5−5 | 7D = 7−5 |
| 1C = 1−4 | 3C = 3−4 | 5C = 5−4 | 7C = 7−4 |
| 1B = 1−3 | 3B = 3−3 | 5B = 5−3 | 7B = 7−3 |
| 1A = 1−2 | 3A = 3−2 | 5A = 5−2 | 7A = 7−2 |
| 19 = 1−1 | 39 = 3−1 | 59 = 5−1 | 79 = 7−1 |
| 18 = 1−0 | 38 = 3−0 | 58 = 5−0 | 78 = 7−0 |
| 11 = 1+1 | 31 = 3+1 | 51 = 5+1 | 71 = 7+1 |
| 12 = 1+2 | 32 = 3+2 | 52 = 5+2 | 72 = 7+2 |
| 13 = 1+3 | 33 = 3+3 | 53 = 5+3 | 73 = 7+3 |
| 14 = 1+4 | 34 = 3+4 | 54 = 5+4 | 74 = 7+4 |
| 15 = 1+5 | 35 = 3+5 | 55 = 5+5 | 75 = 7+5 |
| 16 = 1+6 | 36 = 3+6 | 56 = 5+6 | 76 = 7+6 |
| 17 = 1+7 | 37 = 3+7 | 57 = 5+7 | 77 = 7+7 |
| 2F = 2−7 | 4F = 4−7 | 6F = 6−7 | |
| 2E = 2−6 | 4E = 4−6 | 6E = 6−6 | |
| 2D = 2−5 | 4D = 4−5 | 6D = 6−5 | |
| 2C = 2−4 | 4C = 4−4 | 6C = 6−4 | |
| 2B = 2−3 | 4B = 4−3 | 6B = 6−3 | |
| 2A = 2−2 | 4A = 4−2 | 6A = 6−2 | |
| 29 = 2−1 | 49 = 4−1 | 69 = 6−1 | |
| 28 = 2−0 | 48 = 4−0 | 68 = 6−0 | |
| 21 = 2+1 | 41 = 4+1 | 61 = 6+1 | |
| 22 = 2+2 | 42 = 4+2 | 62 = 6+2 | |
| 23 = 2+3 | 43 = 4+3 | 63 = 6+3 | |
| 24 = 2+4 | 44 = 4+4 | 64 = 6+4 | |
| 25 = 2+5 | 45 = 4+5 | 65 = 6+5 | |
| 26 = 2+6 | 46 = 4+6 | 66 = 6+6 | |
| 27 = 2+7 | 47 = 4+7 | 67 = 6+7 | |

Similarly, the 3:1 codes are:

| | | |
|---|---|---|
| FC = −1−1−1+0 | BC = −0−1−1+0 | 7C = +1−1−1+0 |
| F8 = −1−1−0+0 | B8 = −0−1−0+0 | 78 = +1−1−0+0 |
| F4 = −1−1+1+0 | B4 = −0−1+1+0 | 74 = +1−1+1+0 |
| EC = −1−0−1+0 | AC = −0−0−1+0 | 6C = +1−0−1+0 |
| E8 = −1−0−0+0 | A8 = −0−0−0+0 | 68 = +1−0−0+0 |
| E4 = −1−0+1+0 | A4 = −0−0+1+0 | 64 = +1−0+1+0 |
| DC = −1+1−1+0 | 9C = −0+1−1+0 | 5C = +1+1−1+0 |
| D3 = −1+1−0+0 | 98 = −0+1−0+0 | 58 = +1+1−0+0 |
| D4 = −1+1+1+0 | 94 = −0+1+1+0 | 54 = +1+1+1+0 |

4:1 codes

| | | |
|---|---|---|
| FF = −1−1−1−1 | BF = −0−1−1−1 | 7F = +1−1−1−1 |
| FE = −1−1−1−0 | BE = −0−1−1−0 | 7E = +1−1−1−0 |
| FD = −1−1−1+1 | BD = −0−1−1+1 | 7D = +1−1−1+1 |
| FB = −1−1−0−1 | BB = −0−1−0−1 | 7B = +1−1−0−1 |
| FA = −1−1−0−0 | BA = −0−1−0−0 | 7A = +1−1−0−0 |
| F9 = −1−1−0+1 | B9 = −0−1−0+1 | 79 = +1−1−0+1 |
| F7 = −1−1+1−1 | B7 = −0−1+1−1 | 77 = +1−1+1−1 |
| F6 = −1−1+1−0 | B6 = −0−1+1−0 | 76 = +1−1+1−0 |
| F5 = −1−1+1+1 | B5 = −0−1+1+1 | 75 = +1−1+1+1 |
| EF = −1−0−1−1 | AF = −0−0−1−1 | 6F = +1−0−1−1 |
| EE = −1−0−1−0 | AE = −0−0−1−0 | 6E = +1−0−1−0 |
| ED = −1−0−1+1 | AD = −0−0−1+1 | 6D = +1−0−1+1 |
| EB = −1−0−0−1 | AB = −0−0−0−1 | 6B = +1−0−0−1 |
| EA = −1−0−0−0 | AA = −0−0−0−0 | 6A = +1−0−0−0 |
| E9 = −1−0−0+1 | A9 = −0−0−0+1 | 69 = +1−0−0+1 |
| E7 = −1−0+1−1 | A7 = −0−0+1−1 | 67 = +1−0+1−1 |
| E6 = −1−0+1−0 | A6 = −0−0+1−0 | 66 = +1−0+1−0 |
| E5 = −1−0+1+1 | A5 = −0−0+1+1 | 65 = +1−0+1+1 |
| DF = −1+1−1−1 | 9F = −0+1−1−1 | 5F = +1+1−1−1 |
| DE = −1+1−1−0 | 9E = −0+1−1−0 | 5E = +1+1−1−0 |
| DD = −1+1−1+1 | 9D = −0+1−1+1 | 5D = +1+1−1+1 |
| DB = −1+1−0−1 | 9B = −0+1−0−1 | 5B = +1+1−0−1 |
| DA = −1+1−0−0 | 9A = −0+1−0−0 | 5A = +1+1−0−0 |
| D9 = −1+1−0+1 | 99 = −0+1−0+1 | 59 = +1+1−0+1 |
| D7 = −1+1+1−1 | 97 = −0+1+1−1 | 57 = +1+1+1−1 |
| D6 = −1+1+1−0 | 96 = −0+1+1−0 | 56 = +1+1+1−0 |
| D5 = −1+1+1+1 | 95 = −0+1+1+1 | 55 = +1+1+1+1 |

Decompression

Those skilled in the art will note that extended strings of a constant delta are represented with a "repetition comment" as is done in "run length encoding" methods. In one alternate embodiment of the invention this could be incorporated by using both zero-byte flags in succession to signal transition to repetition count mode. Since by definition the string of constants is the same as the previously written index, just the two zero bytes and a repeat constant need be stored. If the repetition count (which is always positive) is greater than 256 (there are no zero lengths) then we can start a second repetition count immediately after it. There would be a zero byte terminator of one or the other type which would follow the repeat count to signal what the next 1:1 index was, than that index would follow and the process would be out of repetition count mode:

| | | |
|---|---|---|
| 00 | (Hex) | Two zero byte terminators |
| 80 | (Hex) | |
| N | | Repeat Count |
| 00 | | One zero byte terminator (either type) |
| N | | Scaled 1:1 index |
| . | | |
| . | | |
| . | | |
| etc | | Over fairly flat ground or water this would yield significant compression |

Figure 6:
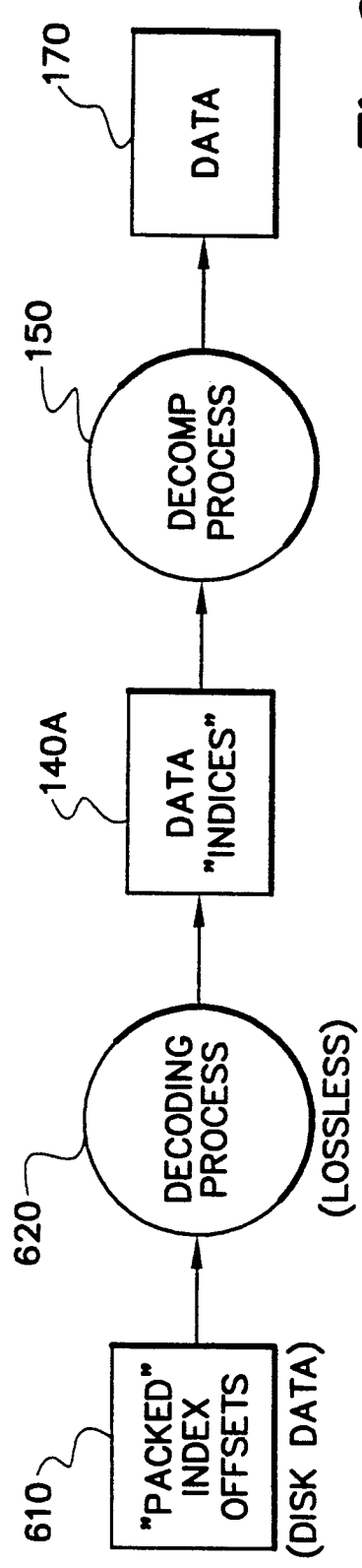
FIG. 6 shows a data flow diagram of one embodiment of the decompression and decoding method of the invention.

The decompression data flow for decompressing the packed index offsets 610 to actual data 170 is illustrated in FIG. 6. The decoding process 620 unpacks the encoded data 610 into index array format using codes such as in the above encoding tables to reconstruct 8 bit data indices 140A from 1:1, 2:1, 3:1 and 4:1 difference data. This could be done in a look-ahead mode to bring up the next anticipated block of data (using direction of flight in a TRN application, for example) on the next block of data off the disk or tape for the TV example.

Figure 7:
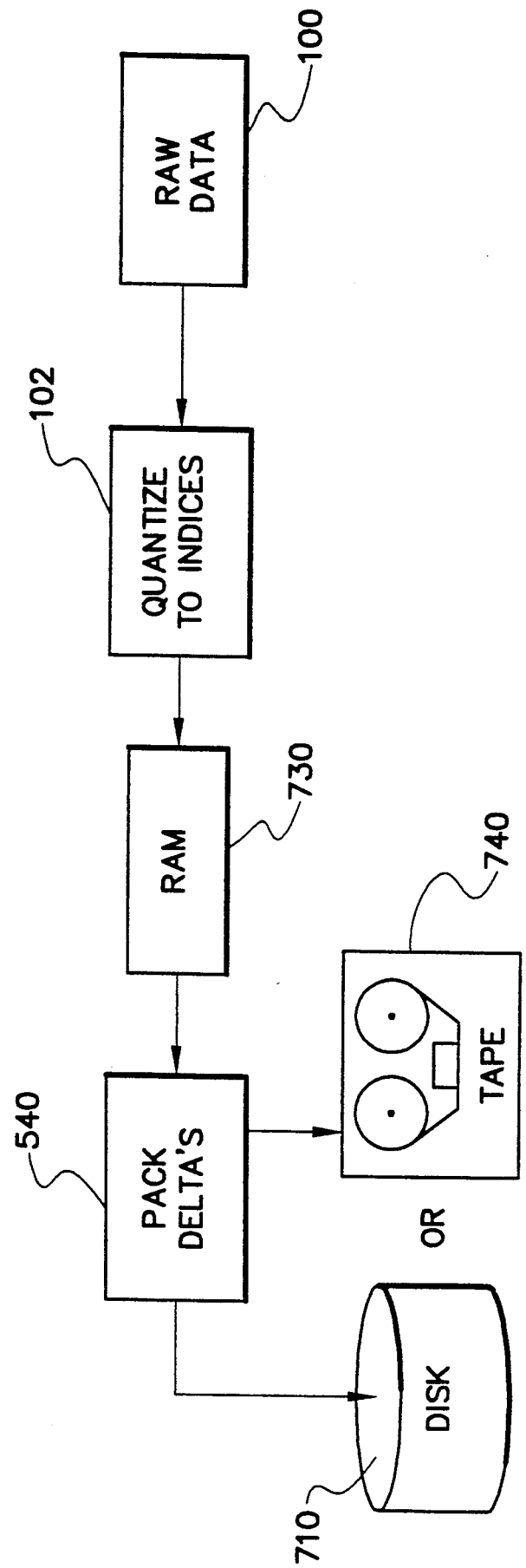
FIG. 7 shows a data flow diagram of one embodiment of the invention used to compress data to disk or tape.

Decompression process 150 proceeds as shown in FIG. 4. There are no losses in the encoding portion of the process step 540. The envisioned compression implementation for TV is shown in FIG. 7. Raw data 100 is quantized by process 102 into an index database stored in RAM 730 following the compression method of the invention. The index is packed using the coding process 540. The packed index database can then be stored on disk 710 or tape 740.

Now referring to FIG. 8 which shows the method of the invention used to broadcast then decompress the raw data 100. The compressed information is transmitted by RF transmitter 720 through RF medium 725 from disk 710 or tape 740. The received signal is decoded by process 620 and unpacked compressed data is stored in RAM 780. Decompression process 150 restores the data to original resolution to database 170. The typical compression is about 4:1 so the data can be transmitted at a rate 4 times slower than used on the screen.

Each database, whether it is 200×200 elevation posts, 250×250 elevation posts for TRN or a single TV frame or high resolution computer video display of 2000 pixels×2000 lines; will have an associated table of indexes which will have 254 entries in it assuming modulus 8.

The table of indices is also compressed by the encoding process 540 before being written on disk as shown in FIG. 7. The structure of the compressed data on the disk or tape is shown in FIG. 9.

In the case of a disk 710, a "header block" 810 should be written which keeps up with the latitudes and longitudes at the NW, NE, SW and SE corner of each data block and the sector number on the disk where that information is stored. Then the accessing program could determine which block was needed and go directly to that sector to get the table of indices and the packed data for the desired block of elevation data.

Those skilled in the art will recognize that when compressing data that exceeds the modulus of index range, in the TRN example the 8 bit byte encodes for 254 elevations, more than one byte of data may be used to start the encoding sequence. Also, elevation changes may require an additional control state that codes for changes in elevation greater than 254 feet.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A source database compression method wherein the source database comprises a first plurality of data points each with a data value, the database compression method comprising the steps of:
   (a) assigning a unique index value to each unique value of the source database;
   (b) generating an index database comprising a second plurality of data corresponding to the first plurality of data points, wherein each second plurality of data points has a value equal to the index value associated with the corresponding data value;
   (c) generating a mode database for each unique value of the source database wherein the mode database contains the frequency of occurrence of each unique value of the source database;
   (d) initializing an accumulated error value to zero;
   (e) locating a least frequent element of the mode database with the smallest frequency of occurrence;
   (f) locating the closest element of the mode database to the least frequency element that minimizes the accumulated error wherein the minimum accumulated error is determined by adding the accumulated error value to the difference between the value of the least frequent element minus the value of the closest element;
   (g) adding the frequency value of the least frequent element to the frequency value of the closest element;
   (h) eliminating the least frequent element from the mode database; and
   (i) repeating steps (c) through (g) until the mode database contains no more than a predetermined number off elements.

2. The source database compression method of claim 1 wherein the source database is a terrain referenced navigation database of elevations for an array of latitudes and longitudes.

3. The source database compression method of claim 1 wherein the index database is further compressed with run length encoding to form a run length encoded database.

4. The source database compression method of claim 1 wherein the index database is further compressed by a method comprising the steps of:
   (a) defining a plurality of system state codes each representing a unique packing density;
   (b) writing a first element of the index database to a packed index database;
   (c) accessing a next element of the index database;
   (d) forming a difference between the last element and the next element;
   (e) determining a current optimum packing density based on the difference;
   (f) writing the system state code which represents the unique packing density which equals the current optimum packing density to the packed index database;
   (g) writing the difference to the packed index database in a packed form in accordance with the current optimum packing density;
   (h) accessing a next element of the indexed database;
   (i) forming the difference between the last element of the index database accessed and the next index database element;
   (j) determining a next optimum packing density based on the difference;
   (k) writing the system state code which represents the unique packing density equal to the current optimum packing density to the packed index database if the next optimum packing density is not equal to the current packing density;
   (l) writing the difference to the packed index database in a packed form; and
   (m) repeating steps (h) through (1) for all elements of the index database.

5. The source database compression method of claim 1 further comprising a decompression method comprising the steps of:
   (a) accessing the compressed database with the desired address to retrieve an index value; and
   (b) accessing the mode database with the index value to retrieve a decompressed data value.

6. The source database compression method of claim 4 further comprising a decompression method comprising the steps of:
   (a) reading a running index value from a first element of the packed index database;
   (b) accessing a next element of the packed index database;
   (c) determining whether or not the next element is a system state code or a packed index value;
   (d) changing the state of the decompression method to the corresponding packing density if the next element is a system state code;
   (e) unpacking the packed indexes from the next element if the next element is a packed index value and adding the unpacked indexes to the running index value; and
   (f) repeating steps (b) through (e) for all elements of the index database.

7. The source database compression method of claim 4 wherein a zero-byte flag is used in succession to signal a transition to a repetition count mode.

8. A source database compression apparatus wherein the source database comprises a first plurality of data points each with a data value, the database compression apparatus comprising:
(a) means for assigning a uniform index value to each unique value of the source database;
(b) means for generating an index database comprising a second plurality of data points corresponding to the first plurality of data points, wherein each second plurality of data points has a value equal to the index value associated with the corresponding data value;
(c) means for generating a mode database for each unique value of the source database wherein the mode database contains the frequency of occurrence of each unique value of the source database;
(d) means for initializing an accumulated error value to zero;
(e) means for locating a least frequent element of the mode database with the smallest frequency of occurrence;
(f) means for locating the closest element of the mode database to the least frequent element that minimizes the accumulated error;
(g) means for adding the accumulated error value to the difference between the value of the least frequent element minus the value of the closest element to determine the minimum accumulated error;
(h) means for adding the frequency value of the least frequent element to the frequency value of the closest element; and
(i) means for eliminating the least frequent element from the mode database.

9. The source database compression apparatus of claim 8 wherein the source database is a terrain referenced navigation database of elevations for an array of latitudes and longitudes.

10. The source database compression apparatus of claim 8 wherein the index database is further compressed with run length encoding to form a run length encoded database.

11. The source database compression apparatus of claim 8 wherein the index database is further compressed by an apparatus comprising:
(a) means for defining a plurality of system state codes each representing a unique packing density;
(b) means for writing a first element of the index database to a packed index database;
(c) means for accessing a next element of the index database;
(d) means for forming a difference between the last element and the next element;
(e) means for determining a current optimum packing density based on the difference;
(f) means for writing the system state code which represents the unique packing density which equals the current optimum packing density to the packed index database;
(g) means for writing the difference to the packed index database in a packed form in accordance with the current optimum packing density;
(h) means for accessing a next element of the indexed database;
(i) means for forming the difference between the last element of the index database accessed and the next index database element;
(j) means for determining a next optimum packing density based on the difference;
(k) means for writing the system state code to the packed index database, wherein the system state code represents the unique packing density equal to the current optimum packing density, and wherein the means for writing writes the system state code if the next optimum packing density is not equal to the current packing density; and
(l) means for writing the difference to the packed index database in a packed form.

12. The source database compression apparatus of claim 8 further comprising a decompression apparatus comprising:
(a) means for accessing the compressed database with the desired address to retrieve an index value; and
(b) means for accessing the mode database with the index value to retrieve a decompressed data value.

13. The source database compression apparatus of claim 11 further comprising a decompression apparatus comprising:
(a) means for reading a running index value from a first element of the packed index database;
(b) means for accessing a next element of the packed index database;
(c) means for determining whether or not the next element is a system state code or a packed index value;
(d) means for changing the state of the decompression apparatus to the corresponding packing density if the next element is a system state code;
(e) means for unpacking the packed indexes from the next element if the next element is a packed index value; and
(f) means for adding the unpacked indexes to the running index value.

14. The source database compression apparatus of claim 11 wherein a zero-byte flag is used in succession to signal transition to a repetition count mode.

15. The source database compression method of claim 1 wherein the source database comprises digital data of a first predetermined bit length and the index database comprises digital data of a second predetermined bit length such that the second predetermined bit length is less then the first predetermined bit length.

16. The source database compression apparatus of claim 8 wherein the source database comprises digital data of a first predetermined bit length and the index database comprises digital data of a second predetermined bit length such that the second predetermined bit length is less then the first predetermined bit length.

* * * * *